(12) United States Patent
Baus et al.

(10) Patent No.: US 12,405,330 B2
(45) Date of Patent: Sep. 2, 2025

(54) CERAMIC TOROIDAL CABLE TRAP

(71) Applicant: GE Precision Healthcare LLC, Waukesha, WI (US)

(72) Inventors: Edward Joseph Baus, Akron, OH (US); Richard Earl Martin, Warren, OH (US); Jana Michelle Vincent, Aurora, OH (US)

(73) Assignee: GE Precision Healthcare LLC

( * ) Notice: Subject to any disclaimer, the term of this patent is extended or adjusted under 35 U.S.C. 154(b) by 158 days.

(21) Appl. No.: 18/377,534

(22) Filed: Oct. 6, 2023

(65) Prior Publication Data

US 2025/0116737 A1    Apr. 10, 2025

(51) Int. Cl.
*G01R 33/36* (2006.01)
*G01R 33/34* (2006.01)
*G01R 33/3415* (2006.01)

(52) U.S. Cl.
CPC ... *G01R 33/3685* (2013.01); *G01R 33/34084* (2013.01); *G01R 33/3415* (2013.01); *G01R 33/3657* (2013.01)

(58) Field of Classification Search
CPC .......... G01R 33/34084; G01R 33/3415; G01R 33/3657; G01R 33/34053; G01R 33/3685; G01V 3/26; G01V 3/28; H01F 17/062; H01F 17/065
USPC ....................................................... 324/546
See application file for complete search history.

(56) References Cited

U.S. PATENT DOCUMENTS

| | | | |
|---|---|---|---|
| 6,593,744 B2 | 7/2003 | Burl et al. | |
| 7,513,031 B2 | 4/2009 | Pleskach et al. | |
| 8,860,543 B2 | 10/2014 | Schaffer et al. | |
| 11,460,525 B2 | 10/2022 | Taracila et al. | |
| 2006/0176140 A1* | 8/2006 | Skendzic | H01F 5/003 336/225 |
| 2017/0104419 A1* | 4/2017 | Zeng | H02M 5/293 |
| 2018/0160567 A1* | 6/2018 | Williams | H01F 17/062 |
| 2020/0350105 A1* | 11/2020 | Sergi | H01F 27/2823 |
| 2021/0247475 A1* | 8/2021 | Taracila | G01R 33/3685 |

(Continued)

OTHER PUBLICATIONS

Karasan et al., "The Very RF Hungry Caterpillar Trap (Highly Flexible, Distributed System of Toroid Cable Traps)", Proc. Intl. Soc. Mag. Reson. Med. 28, 2020, 3 pgs.

(Continued)

*Primary Examiner* — Roberto Velez
(74) *Attorney, Agent, or Firm* — Fletcher Yoder, P.C.

(57) ABSTRACT

A current cable trap includes a ceramic toroid body having a first end and a second end. The ceramic toroid body includes grooves disposed on a surface of the ceramic toroid body and extending between the first end and the second end. The current cable trap also includes conductive traces formed within the grooves. A method for manufacturing a current cable trap includes forming a ceramic toroid body having a first end and a second end. The ceramic toroid body includes grooves disposed on a surface of the ceramic toroid body and extending between the first end and the second end. The grooves extend along both an inner surface and an outer surface of the ceramic toroid body between the first end and the second end. The method also includes performing metallization to form conductive traces within the grooves.

15 Claims, 11 Drawing Sheets

(56) References Cited

U.S. PATENT DOCUMENTS

2021/0364561 A1* 11/2021 Vallamkondu ............ B64F 5/60
2021/0407770 A1* 12/2021 Moses ............... H01J 37/32082

OTHER PUBLICATIONS

Karasan et al., "Advances in Caterpillar Traps: A Highly Flexible, Distributed System of Toroid Cable Traps," Proc. Intl. Soc. Mag. Reson. Med. 29, 2021, 3pgs.
U.S. Appl. No. 18/131,419, filed Apr. 16, 2023, Taracila.

* cited by examiner

CERAMIC TOROIDAL CABLE TRAP

BACKGROUND

The subject matter disclosed herein relates to medical imaging and, more particularly, to a ceramic toroidal cable trap.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During magnetic resonance imaging (MRI), when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Typically, one or more baluns or floating cable traps are disposed along a cable that connects a radio frequency (RF) coil (e.g., body coil) to an MRI system. The floating cable traps reduce currents along the cable for patient safety. Typically, these floating cable traps are prone to detuning and typically need to be placed relatively far apart along the cable to avoid detuning. In addition, these floating cable traps are typically large and bulky. The bulk and mass of the floating cable traps make it difficult to place the cable in position for the patient. Further, these floating cable traps generate a significant amount of heat. These floating cable traps are highly sensitive to position and must be placed at certain wavelength intervals for optimal performance and to minimize heating. Even further usability studies have shown that the bulky size of the floating cable traps often results in them being used as carrying handles, which has resulted in shifts in balun placement.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a current cable trap is provided. The current cable trap includes a ceramic toroid body having a first end and a second end. The ceramic toroid body includes grooves disposed on a surface of the ceramic toroid body and extending between the first end and the second end. The current cable trap also includes conductive traces formed within the grooves.

In another embodiment, a method for manufacturing a current cable trap is provided. The method includes forming a ceramic toroid body having a first end and a second end. The ceramic toroid body includes grooves disposed on a surface of the ceramic toroid body and extending between the first end and the second end. The grooves extend along both an inner surface and an outer surface of the ceramic toroid body between the first end and the second end. The method also includes performing metallization to form conductive traces within the grooves.

In a further embodiment, a cable for a radio frequency receiving coil assembly configured for use with a magnetic resonance imaging system is provided. The cable includes a plurality of current cable traps disposed about the cable. Each current cable trap of the plurality of current cable traps includes an additively manufactured ceramic toroid body having a first end and a second end. The additively manufactured ceramic toroid body includes grooves disposed on a surface of the additively manufactured ceramic toroid body and extending between the first end and the second end. Each current cable trap of the plurality of current cable traps includes conductive traces formed within the grooves via metallization. Each current cable trap of the plurality of current cable traps is configured to be insensitive to detuning caused by changes in temperature.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

Figure 1:
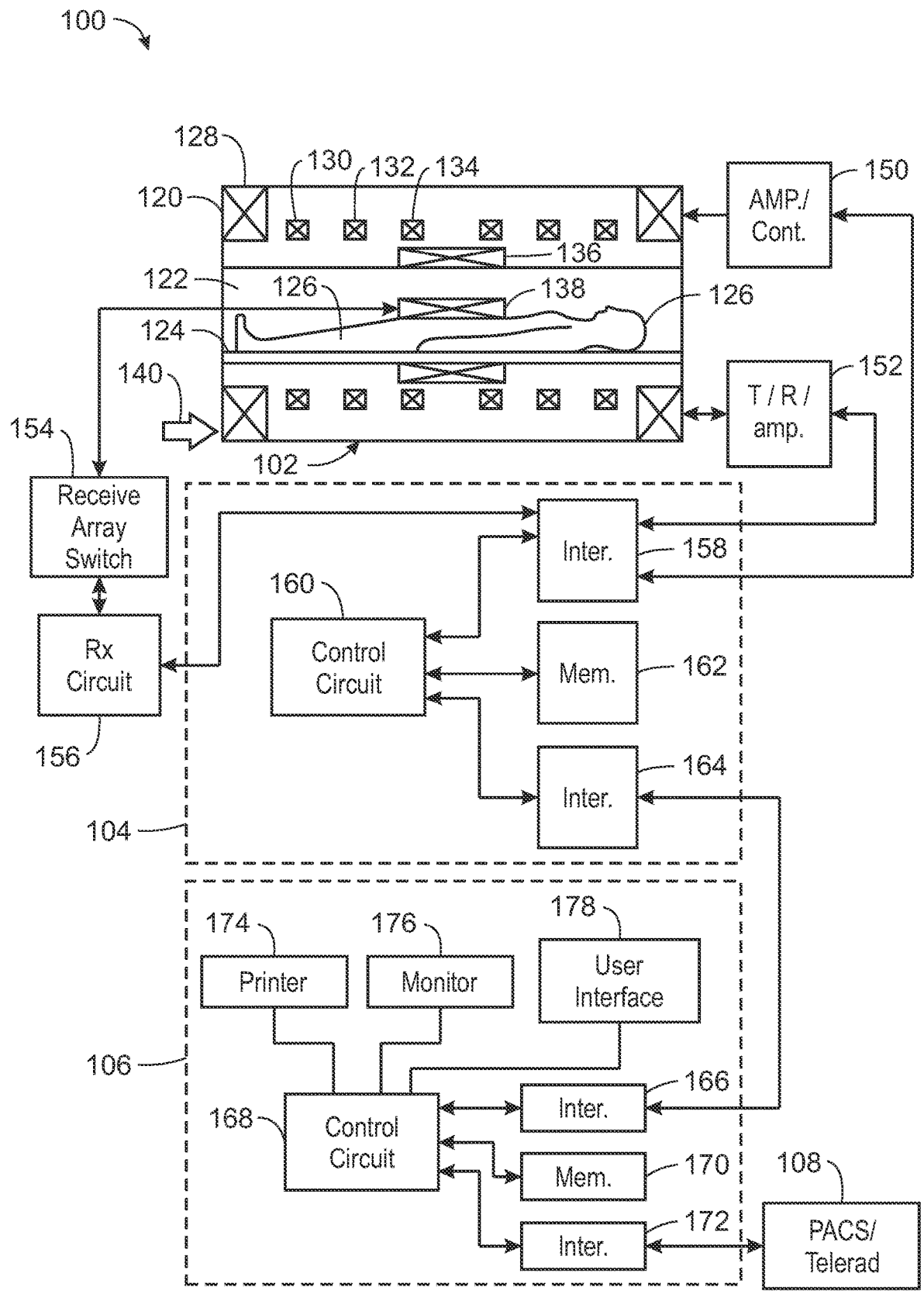
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

The present disclosure provides for a current cable trap (e.g., floating cable trap) or balun having a ceramic toroidal body. The current cable trap includes a ceramic toroid body having a first end and a second end. The ceramic toroid body includes grooves disposed on a surface of the ceramic toroid body and extending between the first end and the second end. The current cable trap also includes conductive traces formed within the grooves. In certain embodiments, the current cable trap is additively manufactured (e.g., via three-dimensional (3D) printing) with the grooves. In certain embodiments, the conductive traces (e.g., metallics traces or plates) are formed within the grooves via a metallization process. In certain embodiments, the grooves extend along both an inner surface and an outer surface of the ceramic toroid body between the first end and the second end. In certain embodiments, the conductive traces are disposed beneath an outermost surface of the ceramic toroid body adjacent the grooves. In certain embodiments, the current cable trap further includes an insulation layer disposed within each of the grooves between a respective conductive trace and the surface of the ceramic toroid body.

In certain embodiments, the current cable trap includes one or more capacitors disposed on the ceramic toroid body and configured to tune the current cable trap to a desired frequency. In certain embodiments, at least one conductive trace of the conductive traces is segmented into at least two segments. In certain embodiments, at least one capacitor of the one or more capacitors is disposed between and coupled to the at least two segments within one of the grooves. In certain embodiments, the one or more capacitors may be coupled in series with one of the grooves. In certain embodiments, the ceramic toroid body includes at least one recess formed adjacent at least one groove of the grooves. In certain embodiments, the at least one capacitor of the one or more capacitors is disposed within the at least one recess and is coupled to one of the conductive traces.

In certain embodiments, the ceramic toroid body is formed as a single part. In certain embodiments, the ceramic toroid body is formed as two halves that are configured to be coupled together about a cable to form the ceramic toroid body disposed about the cable.

In certain embodiments, the grooves are disposed in parallel with a longitudinal axis of the ceramic toroid body extending between the first end and the second end. In certain embodiments, the grooves are disposed in a non-parallel arrangement relative to the longitudinal axis. In certain embodiments, the grooves are disposed at an angle greater than zero degrees relative to the longitudinal axis of the ceramic toroid body extending between the first end and the second end. In certain embodiments, the current cable trap is configured to be insensitive to de-tuning created by changes in temperature.

In certain embodiments, a method for manufacturing a current cable trap is provided includes forming a ceramic toroid body having a first end and a second end. The ceramic toroid body includes grooves disposed on a surface of the ceramic toroid body and extending between the first end and the second end. The grooves extend along both an inner surface and an outer surface of the ceramic toroid body between the first end and the second end. The method also includes performing metallization to form conductive traces within the grooves. In certain embodiments, forming the ceramic toroid body includes additively manufacturing (e.g., 3D printing) the ceramic toroid body. In certain embodiments, disposing an insulation layer within each of the grooves between a respective conductive trace and the surface of the ceramic toroid body. In certain embodiments, the method includes forming the ceramic toroid body as a single part. In certain embodiments, the method includes forming the ceramic toroid body as two halves that are configured to be coupled together about a cable to form the ceramic toroid body disposed about the cable In certain embodiments, a cable for a radio frequency receiving coil assembly configured for use with a magnetic resonance imaging system includes a plurality of current cable traps disposed about the cable. Each current cable trap of the plurality of current cable traps includes an additively manufactured ceramic toroid body having a first end and a second end. The additively manufactured ceramic toroid body includes grooves disposed on a surface of the additively manufactured ceramic toroid body and extending between the first end and the second end. Each current cable trap of the plurality of current cable traps includes conductive traces formed within the grooves via metallization. Each current cable trap of the plurality current cable traps is configured to be insensitive to de-tuning caused by changes in temperature. In addition, in certain embodiments (when the ceramic toroid body has two halves) each current cable trap is configured to be removed (e.g., when broken) from the cable without needing to remove other current cable traps disposed along the cable. In certain embodiments, the cable couples a radio frequency (RF) receiving coil assembly to a connector that is configured to couple the RF receiving coil assembly to an MRI system (e.g., having the current cable traps located external to the RF receiving coil assembly). In certain embodiments, the cable (e.g., having the current cable traps) is disposed within an enclosure of the radio frequency receiving coil assembly having an RF coil configured for use with an MRI system.

Although the current cable traps are discussed in the context of an MRI system, the current cable traps may be utilized within a dual imaging modality system. For example, the current cable traps may be utilized with a positron emission tomography (PET)/MRI system.

The disclosed ceramic toroid cable traps (manufactured as described herein) have a very consistent shape that is not significantly impacted by temperature or by stress (e.g., caused by bending of the cable to which the current cable traps are couple to). The manufacturing of the ceramic toroid current traps is simpler and eliminates the need to wind a conductor around the body or structure to create an inductance. Having a consistent configuration for the ceramic toroid cable trap as well as a smaller shape than typical current cable traps reduces the potential for localized heating. The combined performance of multiple ceramic toroid cable traps results in common mode current suppression along the system cable as well as internal coil cabling. Besides reducing the risk of patient burns, overall coil heating is reduced leading to a safer coil that does not need as much insulating material. This enables a safer, lighter-weight cable. In certain embodiments, the disclosed current cable traps (when the ceramic toroid body has two halves) also improve serviceability since individual current cable traps due to the split configuration can be individually removed and replaced along the cable. The disclosed current cable traps allow for reduced labor time (e.g., due to faster cable assembly times due to minimal tuning or finishing) and reduced material cost (e.g., due to removing internal material within the coil) for current cable assembly.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 (e.g., subject) to be positioned therein for imaging selected anatomy within the patient.

Scanner 102 includes a series of associated coils for producing controlled magnetic fields for exciting the gyromagnetic material within the anatomy of the patient being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain gyromagnetic nuclei within the patient 126 as they return to their relaxed state.

As describe in greater detail below, one or more current cable traps may be disposed about a cable of the RF receiving coil. The current cable traps may include a ceramic toroid body. In certain embodiments, the ceramic toroid body may be a single part. In certain embodiments, the ceramic toroid body may be two halves coupled (e.g., snapped) together about the cable of the RF receiving coil.

The current cable traps include grooves disposed (e.g., formed) in the surface of the ceramic toroid body. Conductive traces or plates or formed in the respective of the ceramic toroid body of the current cable traps. This eliminates the need to wind a conductor wire around the structure to create inductance. The current cable traps with ceramic toroid body are not significantly impacted by temperature or stress (e.g., caused by bending of the cable to which it is attached).

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, Bo. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
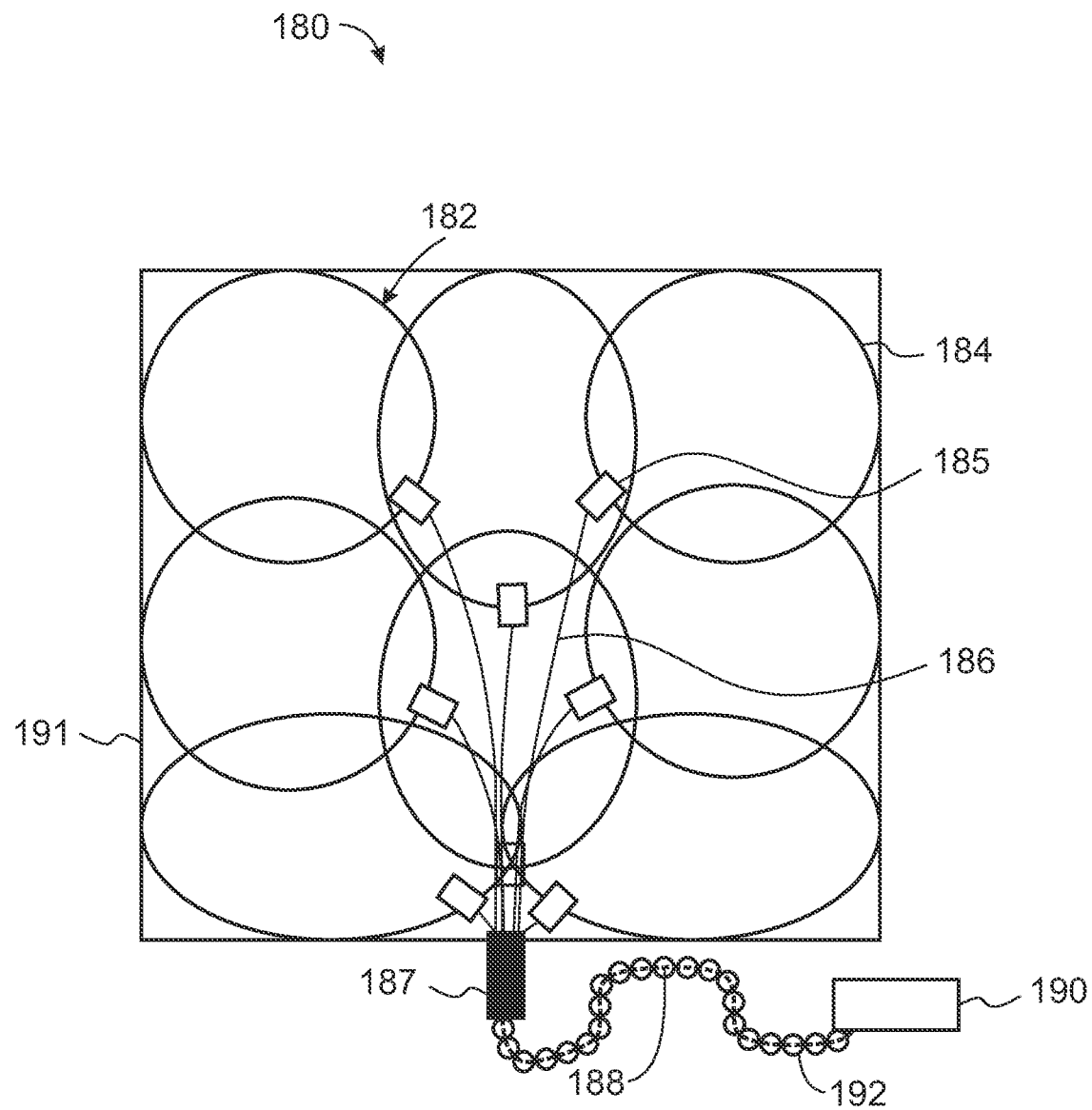
FIG. 2 is a schematic diagram of an RF receiving coil array and is topology, in accordance with aspects of the present disclosure.

FIG. 2 is a schematic diagram of an RF receiving coil array or assembly 180 and its topology. The shape and dimensions of the RF receiving coil array 180 may vary from that depicted in FIG. 2. The RF receiving coil array 180 may be utilized in an MRI system (e.g., MRI system 100 in FIG. 1). The RF receiving coil array 180 includes an RF coil 182 (e.g., flexible RF coil) having a plurality of loops 184 (e.g., elements or channels).

As depicted in FIG. 2, the plurality of loops 184 includes 8 loops (although the number of loops 184 may vary). Each loop 184 is coupled to an electronics unit 185 coupled to a coil-interfacing cable 186. The coil-interfacing cables 186 of each of the loops 184 is coupled to a balun 187 (e.g., integrated balun cable harness). Each electronics unit 185 may include various components (e.g., a decoupling circuit, an impedance inverter circuit, and a pre-amplifier). The balun 187 may act as an RF trap. The balun 187 is coupled (via a cable 188) to a P connector 190 (e.g., port connector) that enables the RF receiving coil 180 to be coupled to the interface of the MRI system that couples imaging components to processing components.

The loops 184 are disposed within an enclosure 191. In certain embodiments, the enclosure may be flexible. As depicted in FIG. 2, each loop 184 partially overlaps with at least one adjacent loop 184. In certain embodiments, one or more of the RF coils 182 may be designed utilizing AIR™ coil technology from General Electric Healthcare. This enables the RF coil 182 to be lightweight and flexible.

As depicted, a plurality of baluns or current cable traps 192 (e.g., RF traps) having ceramic toroid body made of a single part or two halves are disposed about the cable 188 as described in greater detail below. In certain embodiments, one or more of these baluns or current cable traps 192 may be disposed internally (e.g., within the enclosure 191), for example, about one of the cables 186 as shown schematically in FIG. 3.

Figure 4:
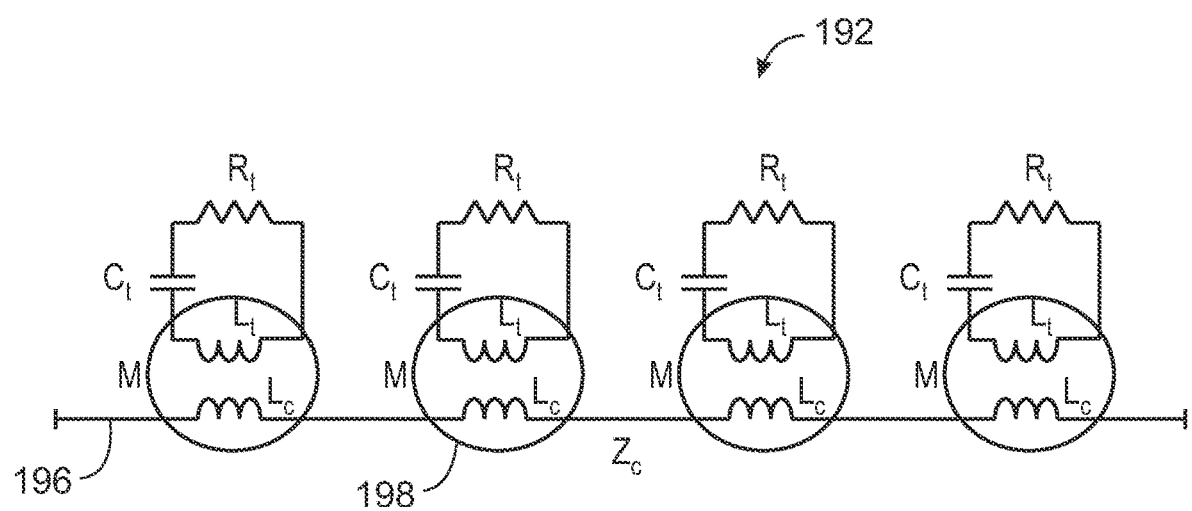
FIG. 4 is a schematic diagram of an electrical circuit formed between a cable and baluns or current cable traps, in accordance with aspects of the present disclosure.

FIG. 4 is a schematic diagram of an electrical circuit 194 formed between a cable 196 (e.g., cable 186 or cable 188 in FIG. 2) and a plurality of baluns or current cable traps 192. The baluns or current cable traps 192 each having a ceramic toroid body made of a single part or two halves as described in greater detail below. As depicted, four current cable traps 192 are disposed about the cable 196. The number of current cable traps 192 may vary. Mutual inductance (M) 198 is formed between each current cable trap 192 and the cable 196. The current cable traps 192 insert a large amount of impedance essentially blocking the path of the current at the proton frequency. In particular, the current cable traps 192 suppress common-mode currents that could lead to RF burns of the patient.

Figure 3:
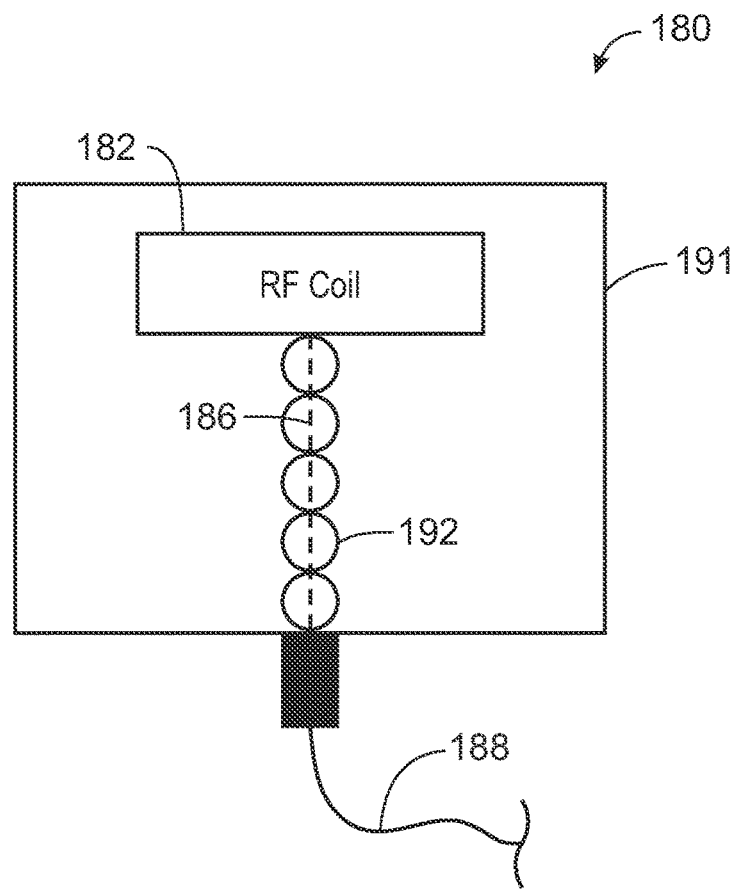
FIG. 3 is a schematic diagram of an RF receiving coil array having internal baluns or current cable traps, in accordance with aspects of the present disclosure.
Figure 6:
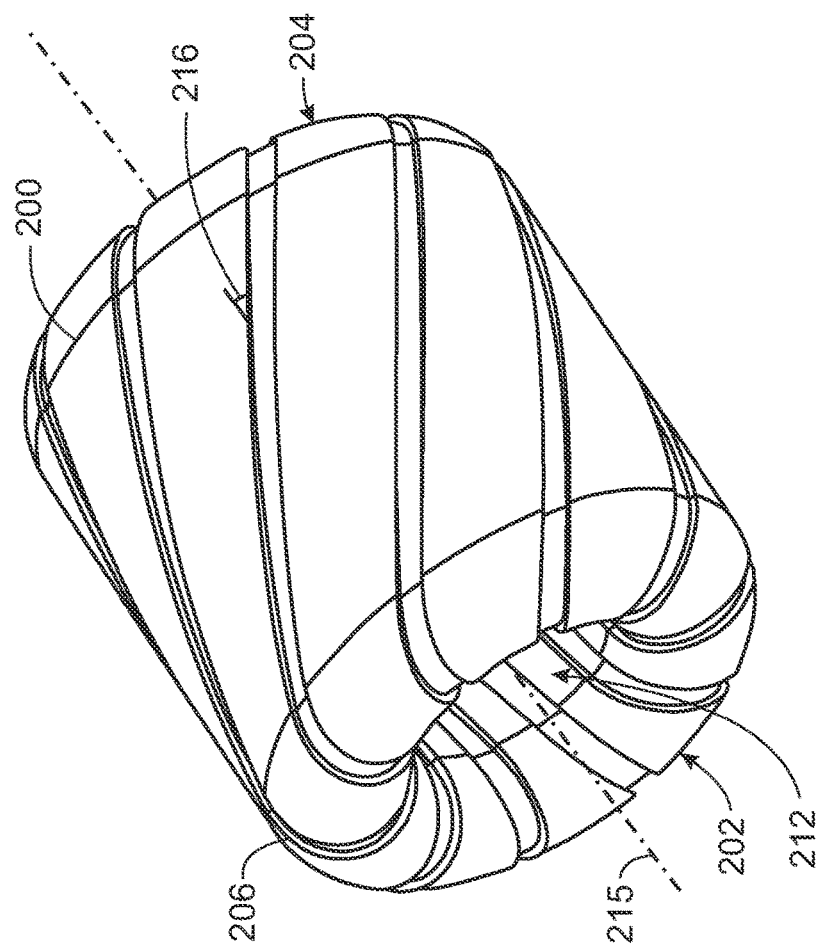
FIG. 6 depicts a schematic diagram of another perspective view of the ceramic toroid body of a current cable trap in FIG. 5, in accordance with aspects of the present disclosure.
Figure 5:
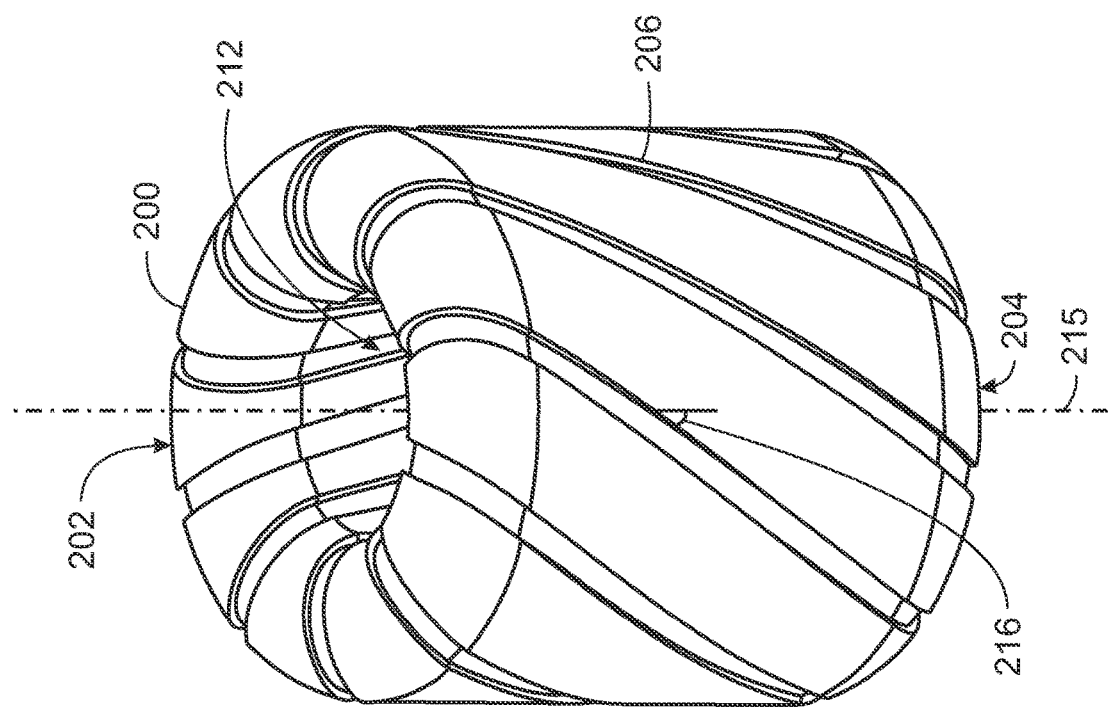
FIG. 5 depicts a schematic diagram of a perspective view of a ceramic toroid body of a current cable trap (e.g., having grooves in a parallel arrangement relative to longitudinal axis), in accordance with aspects of the present disclosure.
Figure 7:
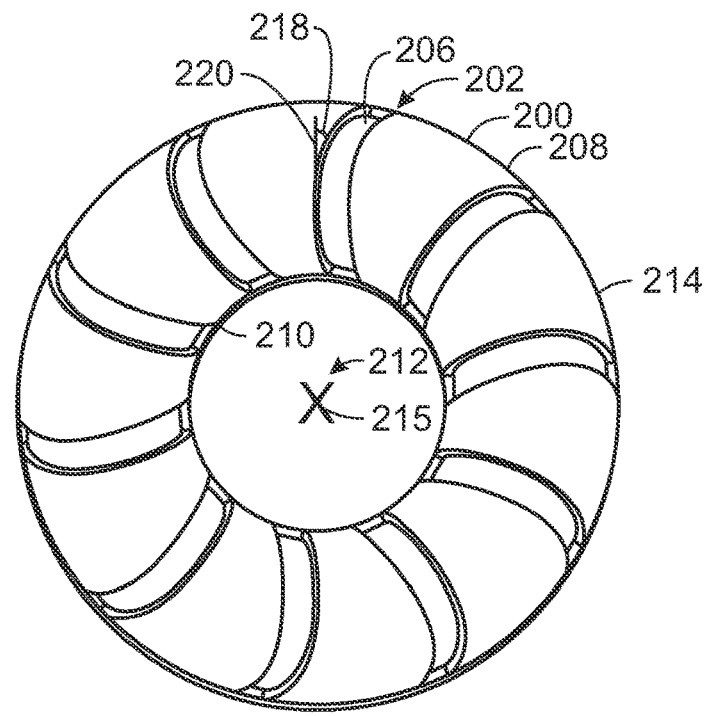
FIG. 7 depicts a schematic diagram of an end view of the ceramic toroid body of a current cable trap in FIG. 5, in accordance with aspects of the present disclosure.

FIGS. 5-7 depict schematic diagrams of different views of a ceramic toroid body 200 of a current cable trap (e.g., current cable trap 192 in FIGS. 2 and 3). As depicted, the ceramic toroid body 200 is made or formed of a single part. In certain embodiments, the ceramic toroid body 200 is made of two halves (see FIG. 8). The size of the ceramic toroid body 200 is smaller than the typical size of a body or structure for a current cable trap. The ceramic toroid body 200 is made of a ceramic material that will not distort with a change in temperature. Thus, the ceramic toroid body 200 (and the current cable trap) is configured to be insensitive to de-tuning caused by changes in temperature. The ceramic toroid body 200 has a first end 202 (e.g., first longitudinal end) and a second end 204 (e.g., second longitudinal end 204). The ceramic toroid body 200 includes a plurality of grooves 206 (e.g., channels) disposed on (e.g., formed in) a surface 208 of the ceramic toroid body 200. The surface 208 of the ceramic toroid body 200 extends from an inner portion 210 of the ceramic toroid body 200 disposed about a bore 212 to an outer portion 214 of the ceramic toroid body 200 (e.g., facing away from the bore 212). Thus, the surface 208 on the inner portion 210 is an inner surface and the surface 208 on the outer portion 214 is an outer surface.

As depicted, the grooves 206 extend along the surface 208 (of the inner portion 210 and the outer portion 214) between the first end 202 and the second end 204. In particular, the grooves 206 (e.g., internal grooves 206 and external grooves 206) extend along (e.g., wind about) both the first end 202, the second end 204, the inner portion 210, and the outer portion 214 of the ceramic toroid body 200. A depth and a width of the grooves 206 may vary depending on the application for the current cable trap. The number of grooves 206 on the ceramic toroid body 200 may vary. As depicted, the grooves 206 are in a non-parallel arrangement relative to a longitudinal axis 215 of the ceramic toroid body 200. As depicted, the grooves 206 are disposed at an angle 216 of greater than zero degrees relative to the longitudinal axis 215 between the first end 202 and the second end 204. On the ends 202, 204, the grooves 206 are disposed at an angle 218 of greater than zero degrees relative to a line 220 perpendicular to the longitudinal axis 215. In certain embodiments, the grooves 206 are parallel with the longitudinal axis 215 between the ends 202, 204 and parallel with the line 220 on the ends 202, 204.

Conductive traces may be formed within the grooves 206 (e.g., via a metallization process such as masking) to create an inductance when the current cable traps are utilized. This avoids having to wrap a wire conductor about the ceramic toroid body 200 to create an inductance. A thickness of the conductive traces (in a direction toward a center of the bore 212) can be adjusted to achieve a desired capacitance. In certain embodiments, the conductive traces are disposed beneath an outermost surface (on the inner portion 210 or the outer portion 214) of the ceramic toroid body adjacent the grooves 206, thus, keeping the conductive traces from being affected by the bending of the cable that the current cable trap is disposed on. In certain embodiments, one or more capacitors may be disposed on the ceramic toroid body 200 and coupled to at least one conductive trace to tune the current cable trap to a desired frequency. In certain embodiments, one or more materials serving as an insulation layer may be disposed between each conductive trace and a respective groove 206 to create a barrier between the ceramic toroid body 200 and the conductive trace.

Figure 8:
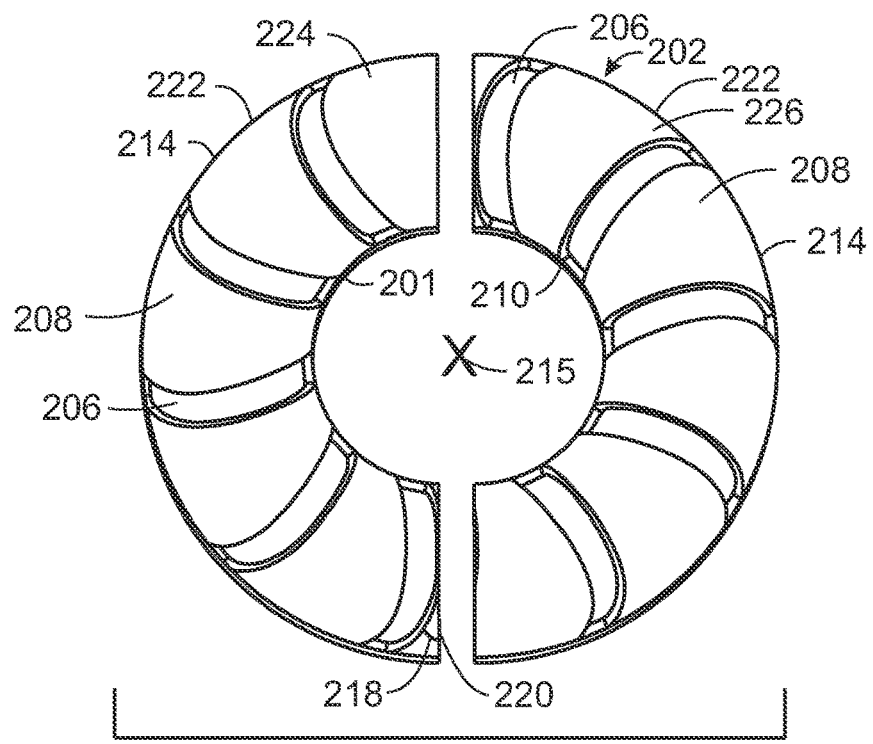
FIG. 8 depicts a schematic diagram of an end view of a ceramic toroid body of a current cable trap (e.g., having two halves), in accordance with aspects of the present disclosure.

FIG. 8 depicts a schematic diagram of an end view of another ceramic toroid body 222 of a current cable trap (e.g., having two halves). As depicted, the ceramic toroid body 222 has a split toroid configuration. In particular, the ceramic toroid body 222 is made or formed of two halves (e.g., a first body half 224 and a second body half 226). In certain embodiments, the first body half 224 and the second body half 226 may be coupled together via snapping them together about a cable. The utilization of a split-toroid configuration enables individual current cable traps due to be individually removed and replaced along the cable as needed.

The size of the ceramic toroid body 222 is smaller than the typical size of a body or structure for a current cable trap. Both halves 224, 226 of the ceramic toroid body 222 are made of a ceramic material that will not distort with a change in temperature. Thus, the ceramic toroid body 222 (and the current cable trap) is configured to be insensitive to de-tuning caused by changes in temperature. Each half 224, 226 of the ceramic toroid body 222 has a respective first end 202 (e.g., first longitudinal end) and a respective second end 204 (e.g., second longitudinal end 204). Each half 224, 226 of the ceramic toroid body 222 includes a respective plurality of grooves 206 (e.g., channels) disposed on (e.g., formed in) a respective surface 208. The surface 208 of each half 224, 226 of the ceramic toroid body 222 extends from an inner portion 210 of the half 224, 226 disposed about a bore (when the halves 224, 226 are coupled) to an outer portion 214 of the half 224, 226 (e.g., facing away from the bore). Thus, the surface 208 on the inner portion 210 is an inner surface and the surface 208 on the outer portion 214 is an outer surface.

As depicted, the grooves 206 on each respective half 224, 226 extend along the surface 208 (of the inner portion 210 and the outer portion 214) between the first end 202 and the second end 204. In particular, the grooves 206 (e.g., internal grooves 206 and external grooves 206) on each respective half 224, 226 extend along (e.g., wind about) both the first end 202, the second end 204, the inner portion 210, and the outer portion 214 of the ceramic toroid body 222. A depth and a width of the grooves 206 may vary depending on the application for the current cable trap. The number of grooves 206 on the ceramic toroid body 222 may vary. As depicted, the grooves 206 on each half 224, 226 are in a non-parallel arrangement relative to a longitudinal axis 215 of the ceramic toroid body 222. As depicted, the grooves 206 are disposed at an angle 216 of greater than zero degrees relative to the longitudinal axis 215 between the first end 202 and the second end 204 (similar to FIGS. 5 and 6). On the ends 202, 204, the grooves 206 are disposed at an angle 218 of greater than zero degrees relative to a line 220 perpendicular to the longitudinal axis 215.

Conductive traces may be formed within the grooves 206 (e.g., via a metallization process such as masking) of each half 224, 226 to create an inductance when the current cable traps are utilized. This avoids having to wrap a wire conductor about the ceramic toroid body 200 to create an inductance. A thickness of the conductive traces (in a direction toward a center of the bore) can be adjusted to achieve a desired capacitance. In certain embodiments, the conductive traces are disposed beneath an outermost surface (on the inner portion 210 or the outer portion 214) of the ceramic toroid body 222 adjacent the grooves 206, thus, keeping the conductive traces from being affected by the bending of the cable that the current cable trap is disposed on. In certain embodiments, one or more capacitors may be disposed on the ceramic toroid body 222 and coupled to at least one conductive trace to tune the current cable trap to a desired frequency. In certain embodiments, one or more materials serving as an insulation layer may be disposed between each conductive trace and a respective groove 206 on each half 224, 226 to create a barrier between the ceramic toroid body 222 and the conductive trace.

Figure 9:
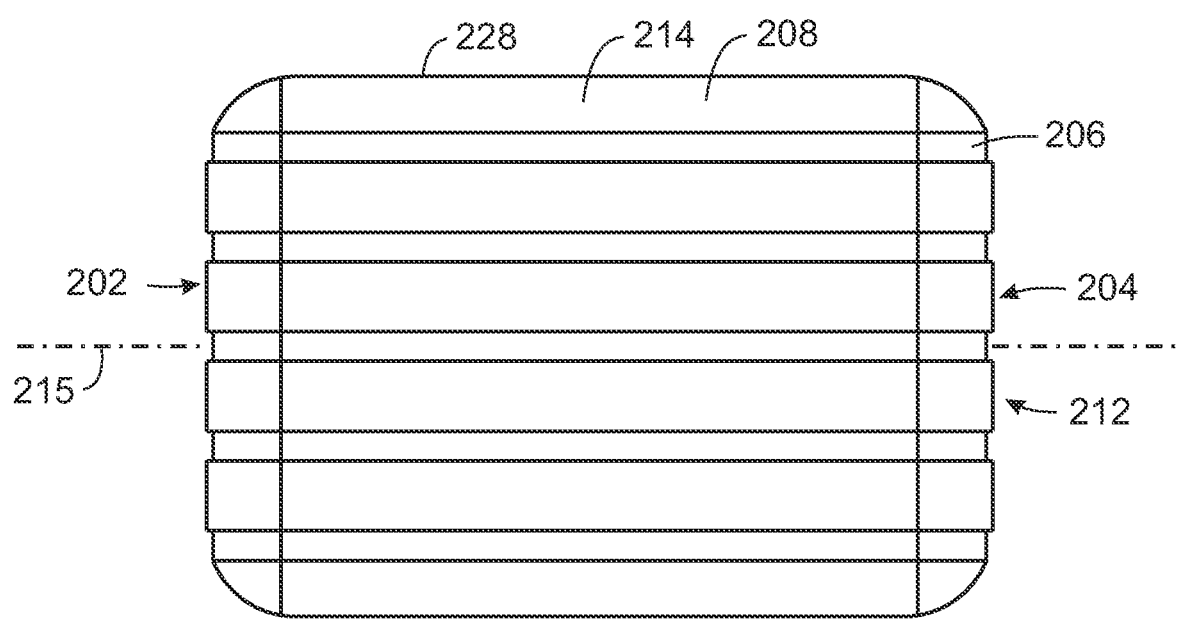
FIG. 9 depicts a schematic diagram of a side view of a ceramic toroid body of a current cable trap (e.g., having grooves in a parallel arrangement relative to longitudinal axis), in accordance with aspects of the present disclosure.

FIG. 9 depicts a schematic diagram of a side view of another ceramic toroid body 228 of a current cable trap (e.g., having grooves in a parallel arrangement relative to longitudinal axis). As depicted, the ceramic toroid body 228 is made or formed of a single part. In certain embodiments, the ceramic toroid body 228 is made of two halves (see FIG. 8). The size of the ceramic toroid body 228 is smaller than the typical size of a body or structure for a current cable trap. The ceramic toroid body 228 is made of a ceramic material that will not distort with a change in temperature. Thus, the ceramic toroid body 228 (and the current cable trap) is configured to be insensitive to de-tuning caused by changes in temperature. The ceramic toroid body 228 has a first end 202 (e.g., first longitudinal end) and a second end 204 (e.g., second longitudinal end 204). The ceramic toroid body 228 includes a plurality of grooves 206 (e.g., channels) disposed on (e.g., formed in) a surface 208 of the ceramic toroid body 228. The surface 208 of the ceramic toroid body 200 extends from an inner portion (e.g., similar to FIGS. 5-8) of the ceramic toroid body 228 disposed about a bore 212 to an outer portion 214 of the ceramic toroid body 228 (e.g., facing away from the bore 212). Thus, the surface 208 on the inner portion is an inner surface and the surface 208 on the outer portion 214 is an outer surface.

As depicted, the grooves 206 extend along the surface 208 (of the inner portion and the outer portion 214) between the first end 202 and the second end 204. In particular, the grooves 206 (e.g., internal grooves 206 and external grooves 206) extend along (e.g., wind about) both the first end 202, the second end 204, the inner portion, and the outer portion 214 of the ceramic toroid body 228. A depth and a width of the grooves 206 may vary depending on the application for the current cable trap. The number of grooves 206 on the ceramic toroid body 2228 may vary. As depicted, the grooves 206 are in a non-parallel arrangement relative to a longitudinal axis 215 of the ceramic toroid body 228. As depicted, the grooves 206 are parallel with the longitudinal axis 215 between the ends 202, 204. The grooves 206 are also parallel with the line 220 (see FIGS. 5 and 6) on the ends 202, 204.

Conductive traces may be formed within the grooves 206 (e.g., via a metallization process such as masking) to create an inductance when the current cable traps are utilized. This avoids having to wrap a wire conductor about the ceramic toroid body 228 to create an inductance. A thickness of the conductive traces (in a direction toward a center of the bore 212) can be adjusted to achieve a desired capacitance. In certain embodiments, the conductive traces are disposed beneath an outermost surface (on the inner portion 210 or the outer portion 214) of the ceramic toroid body adjacent the grooves 206, thus, keeping the conductive traces from being affected by the bending of the cable that the current cable trap is disposed on. In certain embodiments, one or more capacitors may be disposed on the ceramic toroid body 228 and coupled to at least one conductive trace to tune the current cable trap to a desired frequency. In certain embodiments, one or more materials serving as an insulation layer may be disposed between each conductive trace and a respective groove 206 to create a barrier between the ceramic toroid body 228 and the conductive trace.

Figure 10:
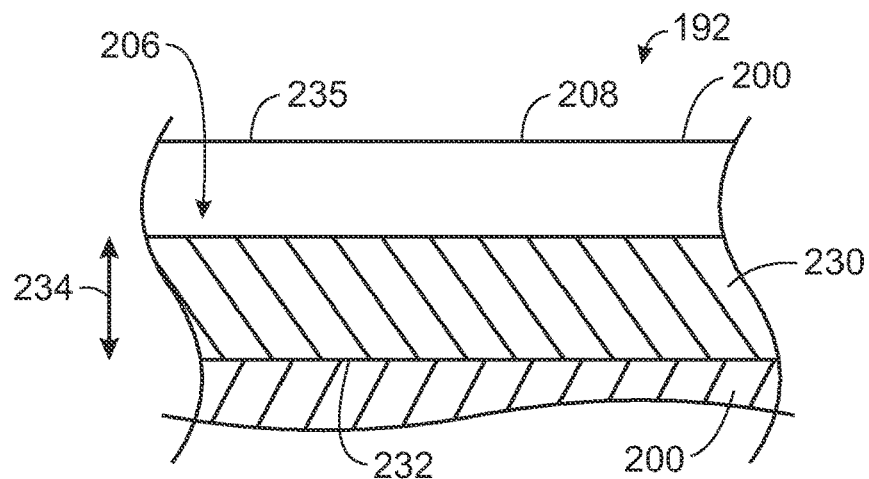
FIG. 10 depicts a schematic diagram of a cross-section of a portion of a current cable trap having a ceramic toroid body and a conductive trace, in accordance with aspects of the present disclosure.

FIG. 10 depicts a schematic diagram of a cross-section (e.g., taken along a middle of the groove 206) of a portion of the current cable trap 192 having the ceramic toroid body 200 and a conductive trace 230. As depicted, the conductive trace 230 (e.g., metallic trace) is disposed on (e.g. formed on) a bottom surface 232 of the groove 206. The groove 206 could be located on the inner portion 210, the outer portion 214, the first end 202, or the second end 204 of the ceramic toroid body 200 in FIGS. 5-7. In certain embodiments, the conductive trace may be formed within the groove 206 (e.g., via a metallization process such as masking) to create an inductance when the current cable trap 192 is utilized. This avoids having to wrap a wire conductor about the ceramic toroid body 200 to create an inductance. A thickness 234 of the conductive trace 230 can be adjusted to achieve a desired capacitance. In certain embodiments, the conductive trace 230 is made of copper. In certain embodiments, the conductive trace 230 may be made of another type of metal in non-MRI applications (e.g., nickel). As depicted, the conductive trace 230 is disposed beneath an outermost surface 235 (on the inner portion 210 or the outer portion 214) of the ceramic toroid body 200 adjacent the groove 206, thus, keeping the conductive trace 206 from being affected by the bending of the cable that the current cable trap 192 is disposed on.

Figure 11:
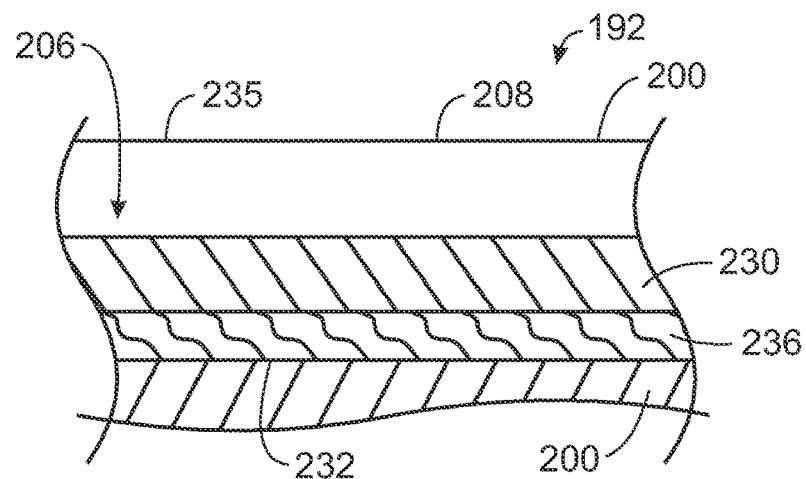
FIG. 11 depicts a schematic diagram of a cross-section of a portion of a current cable trap having a ceramic toroid body, a conductive trace, and insulation layer, in accordance with aspects of the present disclosure.

FIG. 11 depicts a schematic diagram of a cross-section of a portion of the current cable trap 192 having the ceramic toroid body 200, the conductive trace 230, and insulation layer 236. The cable trap 192 is as described in FIG. 10 with the exception of the insulation layer 236. As depicted, the insulation layer 236 is disposed between the conductive trace 230 and the bottom surface 232 of the groove 206. The insulation layer 236 creates a barrier between the ceramic toroid body 200 and the conductive trace 230. In certain embodiments, more than one insulation layer 236 may be disposed between the ceramic toroid body 200 and the bottom surface 232 of the groove 206. In this case, the multiple insulation layers may be made of different materials or the same materials. In certain embodiments, the insulation layer 236 may be epoxies (e.g., Hysol®), glazing, masking, enamel coating, ceramic coating, glass frit, or a mechanical part.

Figure 12:
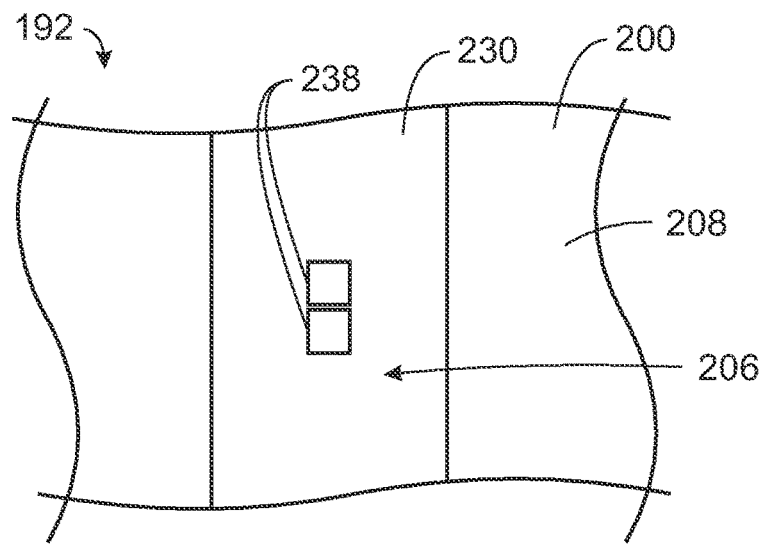
FIG. 12 depicts a schematic diagram of a top view of a portion of a current cable trap having conductors coupled to a conductive trace (e.g., directly on the conductive trace), in accordance with aspects of the present disclosure.

In certain embodiments, one or more capacitors may be disposed on the ceramic toroid body 200 and coupled to at least conductive trace 230 to tune the current cable trap 192 to a desired frequency. FIG. 12 depicts a schematic diagram of a top view of a portion of the current cable trap 192 having conductors 238 coupled to the conductive trace 230 (e.g., directly on the conductive trace 230). As depicted in FIG. 12, a couple of conductors 238 are directly coupled (e.g. soldered) to the conductive trace 230 in series. The number of conductors 238 coupled to the conductive trace 230 may vary.

Figure 13:
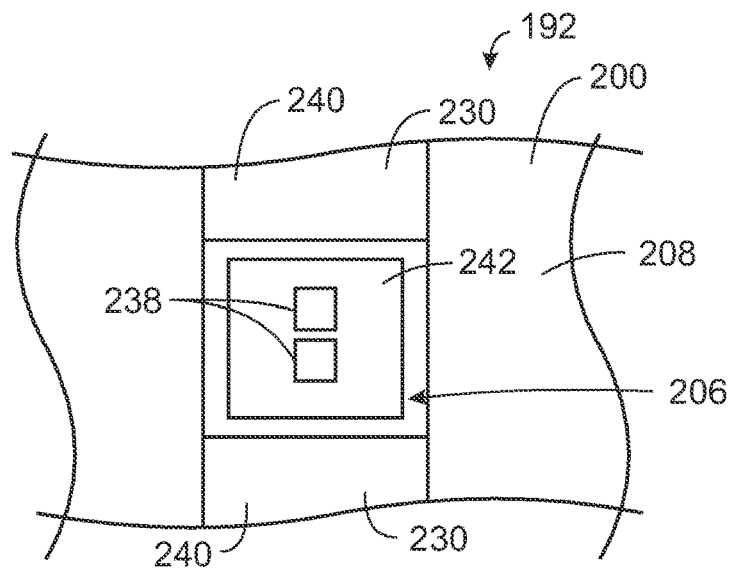
FIG. 13 depicts a schematic diagram of a top view of a portion of a current cable trap having conductors coupled to a conductive trace (e.g., having a segmented conductive trace), in accordance with aspects of the present disclosure.

FIG. 13 depicts a schematic diagram of a top view of a portion of the current cable trap 192 having the conductors 238 coupled to the conductive trace 230 (e.g., having a segmented conductive trace). As depicted, the conductive trace 230 is formed of segments 240 within the groove 206. A printed circuit board 242 is disposed between the segments 240 within the groove 206. The printed circuit board 242 includes a couple of conductors 238 that are coupled to the segments 240 of the conductive trace 230 via electrical connections (not shown) on the printed circuit board 242. The number of conductors 238 may vary.

Figure 14:
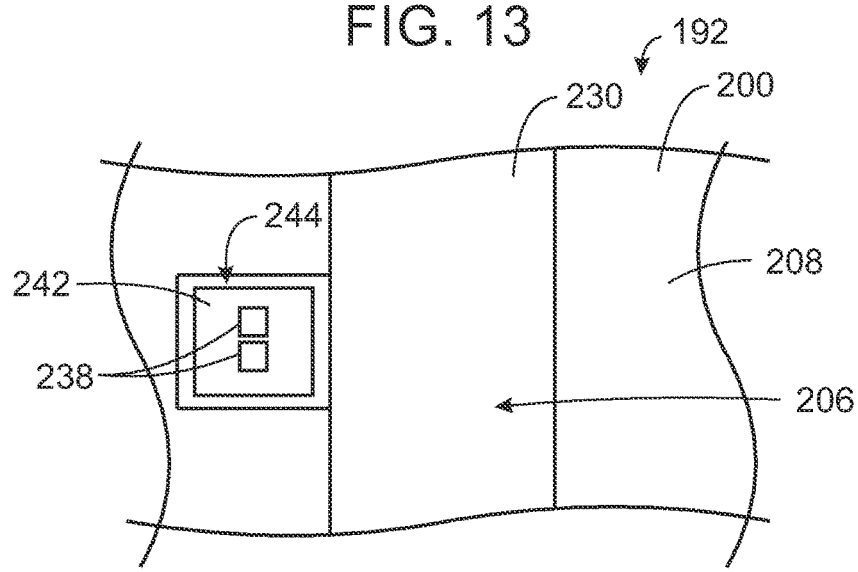
FIG. 14 depicts a schematic diagram of a top view of a portion of a current cable trap having conductors coupled to a conductive trace (e.g., with a recess adjacent to a groove to accommodate the conductors), in accordance with aspects of the present disclosure.

FIG. 14 depicts a schematic diagram of a top view of a portion of the current cable trap 198 having conductors 238 coupled to a conductive trace 230 (e.g., with a recess adjacent to the groove 206 to accommodate the conductors 238). During the formation of the ceramic toroid body 200, at least one recess 244 may be formed in the ceramic toroid body 200 adjacent at least one groove 206. The printed circuit board 242 is disposed within the recess 244. The printed circuit board 242 includes a couple of conductors 238 that are coupled to the conductive trace 230 via electrical connections (not shown) on the printed circuit board 242. The number of conductors 238 may vary.

Figure 15:
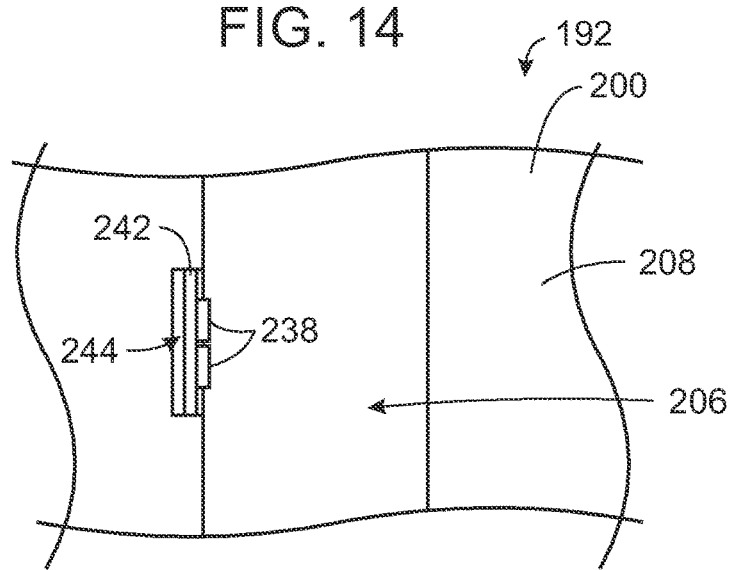
FIG. 15 depicts a schematic diagram of a top view of a portion of a current cable trap having conductors coupled to a conductive trace (e.g., with recess in a side of a groove to accommodate the conductors), in accordance with aspects of the present disclosure.

FIG. 15 depicts a schematic diagram of a top view of a portion of a current cable trap 192 having conductors 238 coupled to the conductive trace 230 (e.g., with recess in a side surface of the groove 206 to accommodate the conductors 238). During the formation of the ceramic toroid body 200, at least one recess 244 may be formed in a side surface 246 of at least one groove 206. The printed circuit board 242 is disposed within the recess 244. The printed circuit board 242 includes a couple of conductors 238 that are coupled to the conductive trace 230 via electrical connections (not shown) on the printed circuit board 242. The number of conductors 238 may vary.

Figure 16:
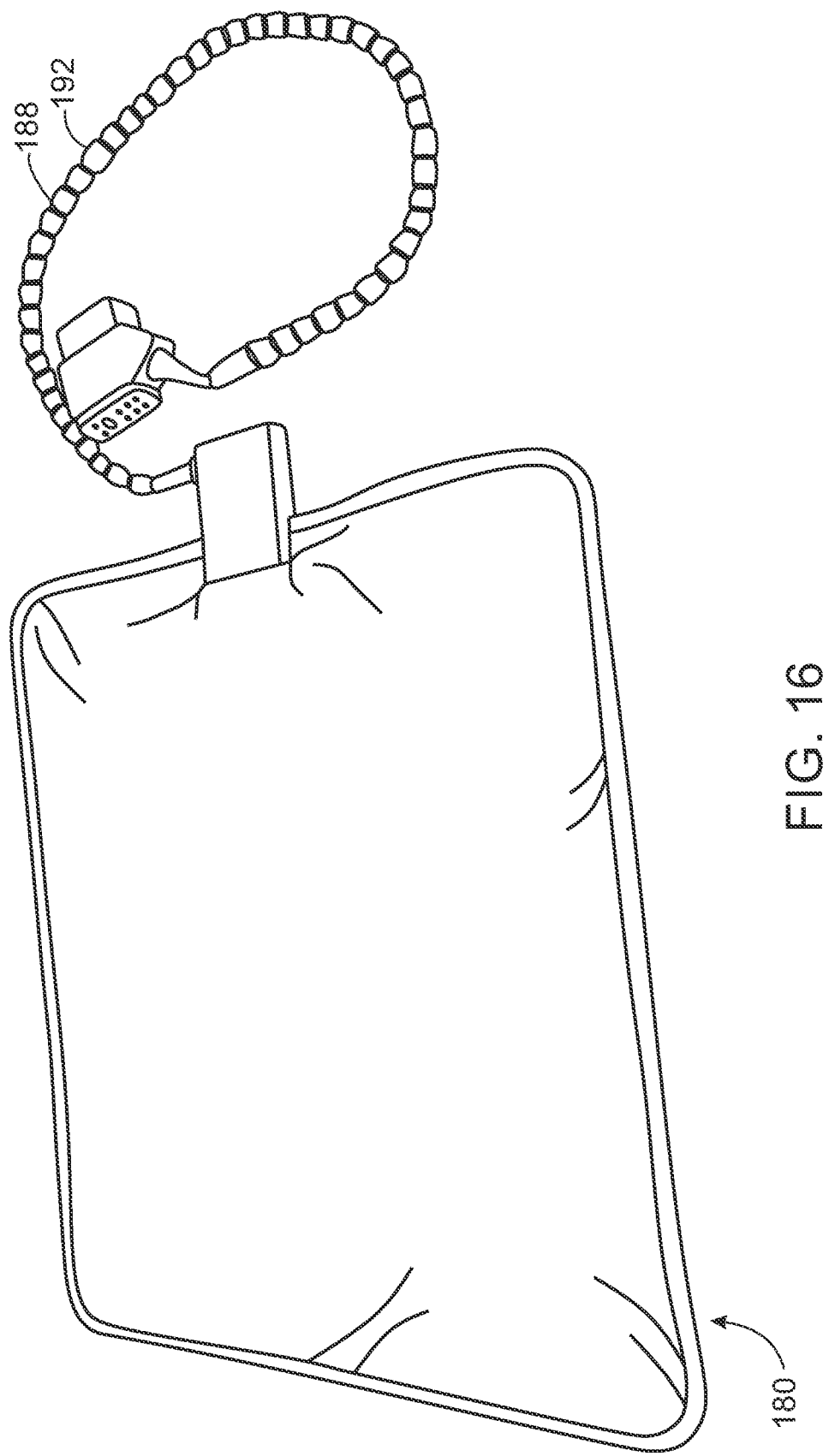
FIG. 16 depicts a schematic diagram an RF receiving coil assembly having current cable traps disposed about a cable, in accordance with aspects of the present disclosure.

FIG. 16 depicts a schematic diagram an RF receiving coil assembly 180 having current cable traps 192 disposed about the cable 188. As depicted in FIG. 11, the current cable traps 192 can be tightly fit together on the cable 188. The number of current cable traps 192 disposed on the cable 188 may vary. Due to their smaller size, a higher density of the current cable traps 192 on the cable 188 and at the coil interface to enhance performance. Further, utilization of the current cable traps (as opposed to standard baluns) reduces an overall weight of the cable.

Among other benefits of the toroid-shaped ceramic current cable trap provides greater thermodynamic stability. In particular, a cable with a plurality of toroid-shaped ceramic current cable traps take less time to stabilize in temperature than a cable with standard cable baluns. The plurality of toroid-shaped current cable traps distributes heat along the cable while eliminating cable hot spots.

Among other benefits of the toroid-shaped ceramic current cable traps are their greater ease of manufacturing. In addition, each of the toroid-shaped current cable traps can be supplied fully assembled and placed on a cable prior to the overmoulding process (thus, no assembly is done on site).

Figure 17:
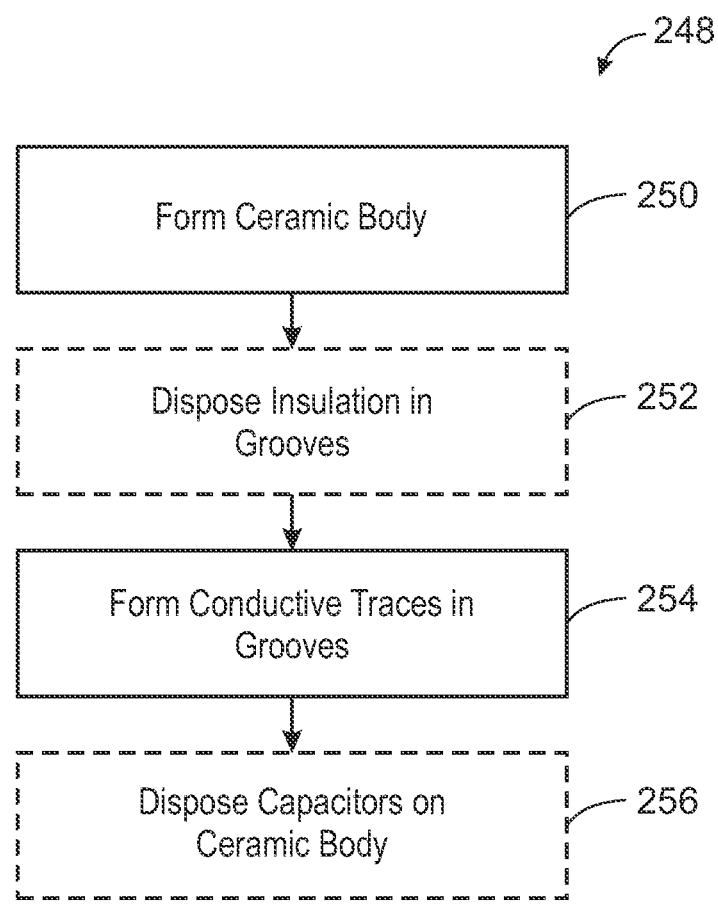
FIG. 17 depicts a method for manufacturing a current cable trap, in accordance with aspects of the present disclosure.

FIG. 17 depicts a flow chart of a method 248 for manufacturing a toroid-shaped current cable trap or balun having a ceramic body. One or more of the steps may be performed simultaneously or in a different order from that depicted in FIG. 17.

The method 248 includes forming a ceramic toroid body (block 250). The ceramic toroid body has a first end and a second end. Forming the ceramic toroid body includes forming a plurality of grooves into a surface of the ceramic toroid body that between the first end and the second end. The grooves extend along both an inner surface and an outer surface of the ceramic toroid body between the first end and the second end. In certain embodiments, forming the ceramic toroid body include forming the ceramic toroid body as a single part. In certain embodiments, forming the ceramic toroid body includes forming a first half of the ceramic toroid body and forming a second half the ceramic toroid body (where the halves of the ceramic toroid body are configured to be coupled (e.g., snapped) together). In certain embodiments, the ceramic toroid body is formed via manufacturing. In certain embodiments, the ceramic toroid body is formed via moulding. In certain embodiments, the ceramic toroid body is additivity manufactured (e.g., 3D printed). The ceramic 3D printing may utilize powder sintering. For example, a ceramic powder may be utilized in printing the ceramic toroid body. Other types of ceramic 3D printing that may be utilized include extrusion, binder jetting, NanoParticle jetting, and photopolymerization. The ceramic material for forming the ceramic toroid body may be aluminum oxide, zirconium oxide, aluminum nitride, silicon carbide, silicon nitride, or another ceramic material. Upon printing the ceramic toroid body, it may be placed in a dryer for drying and then fired to harden the ceramic toroid body. Subsequent to formation of the ceramic toroid body, it may be subjected to cleaning by blasting.

In certain embodiments, the method 248 also includes disposing one or more insulation layers (of one or more different insulation materials) within the grooves of the ceramic toroid body (block 252). The one or more insulation layers would be disposed between the surface of the ceramic toroid body in the groove and the conductor.

The method 248 further includes forming conductive traces in the grooves of the ceramic toroid body (block 254). In certain embodiments, the conductive traces are directly formed on a bottom surface of the grooves. In certain embodiments, the conductive traces are formed on one or more insulation layers disposed within the grooves. In certain embodiments, forming the conductive traces in the grooves includes performing metallization to form the conductive traces within the grooves of the ceramic toroid body. In certain embodiments, masking may be utilized to form the conductive traces in the grooves. In certain embodiments, a vacuum deposition technique may be utilized to form the conductive traces in the grooves. Examples of vacuum deposition techniques include filament (flash) evaporation, electron-beam evaporation, induction evaporation, and sputtering.

In certain embodiments, the method 248 even further includes disposing one or more capacitors on the ceramic toroid body to couple them one or more conductive traces (block 256). In certain embodiments, the one or more capacitors may be directly disposed (e.g., soldered) on one or more conductive traces (e.g., in series). In certain embodiments, the capacitors may be located on a printed circuit board. In certain embodiments, the printed circuit board with the capacitors may be disposed within a recess adjacent a groove in the ceramic toroid body where the capacitors may be coupled to the conductive trace. The recess may be formed with the grooves when the ceramic toroid body is formed. In certain embodiments, the printed circuit board with the capacitors may be disposed within a recess located in a side surface of a groove in the ceramic toroid body where the capacitors may be coupled to the conductive trace. The recess in the side surface of the groove may be formed with the grooves when the ceramic toroid body is formed.

Figure 18:
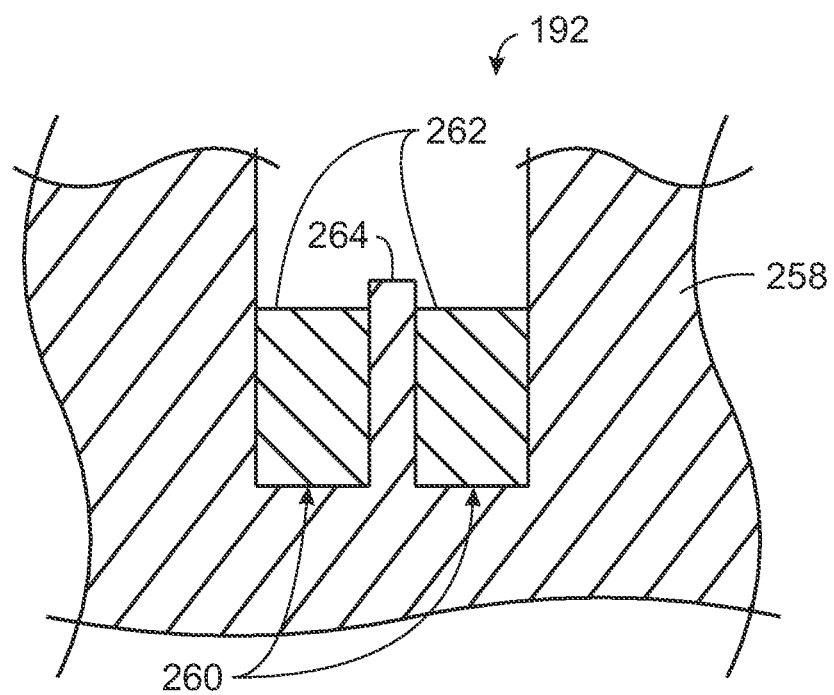
FIG. 18 depicts a schematic diagram of a cross-sectional view of a portion of a current cable trap having parallel grooves with respective conductors.
Figure 19:
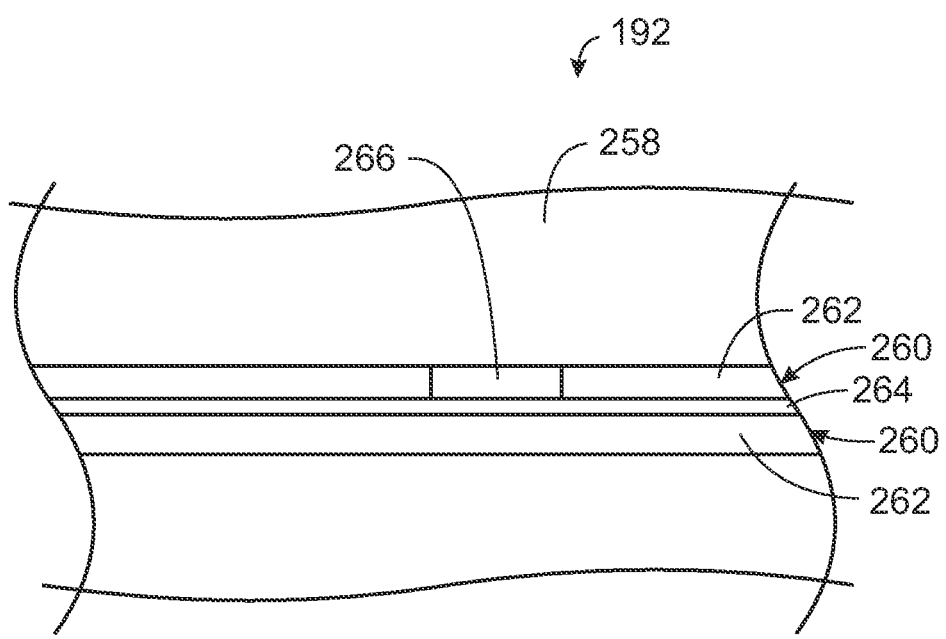
FIG. 19 depicts a schematic diagram of a top view of a portion of current cable trap having parallel grooves with respective conductors.

FIGS. 18 and 19 depicts schematic diagrams of different views of a portion of the current cable trap 192 having parallel grooves with respective conductors. In certain embodiments, a ceramic toroid body 258 (as described above) may include a pair of parallel grooves 260 formed in the ceramic toroid body 258 extending around the length of the ceramic toroid body 258. Respective conductors 262 (as described above) are disposed in the respective grooves 260. Although not shown, in certain embodiments, respective insulators may also be disposed within the grooves 260. A wall or partition 264 is disposed between the grooves 260. In certain embodiments, one groove 260 of the pair of parallel grooves 260 may include a break or gap 266 in the respective conductor 262 to segment the respective conductor 262. The respective conductor 262 may include one or two of these gaps 266. The gap 266 creates resonance. The pair of parallel grooves 260 with the respective conductors 262 functions similarly to a twinaxial wire.

Technical effects of the disclosed subject matter include providing a balun or current cable trap having a ceramic toroid configuration. Technical effects of the disclosed subject matter also include the manufacturing of the ceramic toroid cable traps provides enables a very consistent shape for the ceramic toroid cable traps that is not significantly impacted by temperature or by stress (e.g., caused by bending of the cable to which the current cable traps are couple to). The manufacturing of the ceramic toroid current traps is simpler and eliminates the need to wind a conductor around the body or structure to create an inductance. Having a consistent configuration for the ceramic toroid cable trap as well as a smaller shape than typical current cable traps reduces the potential for localized heating. Technical effects of the disclosed subject matter also include having a combined performance of multiple ceramic toroid cable traps resulting in common mode current suppression along the system cable as well as internal coil cabling. Besides reducing the risk of patient burns, another technical effect of the disclosed subject matter includes reducing overall coil heating which leads to a safer coil that does not need as much insulating material. This enables a safer, lighter-weight cable. In certain embodiments, technical effects of the disclosed subject matter (e.g., when the ceramic toroid body has two halves) also include improving serviceability since individual current cable traps due to the split configuration can be individually removed and replaced along the cable. Technical effects of the disclosed subject matter allow for reduced labor time (e.g., due to faster cable assembly times due to minimal tuning or finishing) and reduced material cost (e.g., due to removing internal material within the coil) for current cable assembly.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A current cable trap, comprising:
   a ceramic toroid body having a first end and a second end, wherein the ceramic toroid body comprises grooves disposed on a surface of the ceramic toroid body and extending between the first end and the second end;
   conductive traces formed within the grooves, wherein the current cable trap is configured to suppress common mode current in a cable; and
   one or more capacitors disposed on the ceramic toroid body and configured to tune the current cable trap to a desired frequency, wherein at least one conductive trace of the conductive traces is segmented into at least two segments, and at least one capacitor of the one or more capacitors is disposed between and coupled to the at least two segments within one of the grooves.

2. The current cable trap of claim 1, wherein the current cable trap is additively manufactured with the grooves.

3. The current cable trap of claim 2, wherein the conductive traces are formed within the grooves via a metallization process.

4. The current cable trap of claim 1, further comprising an insulation layer disposed within each of the grooves between a respective conductive trace and the surface of the ceramic toroid body.

5. The current cable trap of claim 1, wherein the ceramic toroid body is formed as a single part.

6. The current cable trap of claim 1, wherein the ceramic toroid body is formed as two halves that are configured to be coupled together about a cable to form the ceramic toroid body disposed about the cable.

7. The current cable trap of claim 1, wherein the grooves are disposed in parallel with a longitudinal axis of the ceramic toroid body extending between the first end and the second end.

8. The current cable trap of claim 1, wherein the grooves are disposed at an angle greater than zero degrees relative to a longitudinal axis of the ceramic toroid body extending between the first end and the second end.

9. The current cable trap of claim 1, wherein the current cable trap is configured to be insensitive to de-tuning caused by changes in temperature.

10. A method for manufacturing a current cable trap, comprising:
    forming a ceramic toroid body having a first end and a second end, wherein the ceramic toroid body comprises grooves disposed on a surface of the ceramic toroid body and extending between the first end and the second end, and wherein the grooves extend along both an inner surface and an outer surface of the ceramic toroid body between the first end and the second end;
    performing metallization to form conductive traces within the grooves, wherein the current cable trap is configured to suppress common mode current in a cable, wherein at least one conductive trace of the conductive traces is segmented into at least two segments; and
    disposing at least one capacitor between the at least two segments within one of the grooves and coupling the at least one capacitor to the at least two segments, and wherein the at least one capacitor is configured to tune the current cable trap to a desired frequency.

11. The method of claim 10, wherein forming the ceramic toroid body comprises additively manufacturing the ceramic toroid body.

12. The method of claim 10, further comprising disposing an insulation layer within each of the grooves between a respective conductive trace and the surface of the ceramic toroid body.

13. The method of claim 10, wherein the ceramic toroid body is formed as a single part.

14. The method of claim 10, wherein the ceramic toroid body is formed as two halves that are configured to be coupled together about a cable to form the ceramic toroid body disposed about the cable.

15. A cable for a radio frequency receiving coil assembly configured for use with a magnetic resonance imaging system, comprising:
- a plurality of current cable traps disposed about the cable, wherein each current cable trap of the plurality of current cable traps comprises:
  - an additively manufactured ceramic toroid body having a first end and a second end, wherein the additively manufactured ceramic toroid body comprises grooves disposed on a surface of the additively manufactured ceramic toroid body and extending between the first end and the second end; and
  - conductive traces formed within the grooves via metallization; and
- wherein each current cable trap of the plurality of current cable traps is configured to be insensitive to de-tuning caused by changes in temperature and to suppress common mode current in the cable; and
- wherein the additively manufactured ceramic toroid body of each current cable trap comprises at least one recess formed adjacent at least one groove of the grooves, and at least one capacitor is disposed within the at least one recess and is coupled to one of the conductive traces.

* * * * *